United States Patent [19]

Hatch

[11] Patent Number: 4,660,018
[45] Date of Patent: Apr. 21, 1987

[54] HALL EFFECT PROBE
[76] Inventor: Victor W. Hatch, 5200 SE. Jennings Ave., No. 1, Milwaukie, Oreg. 97222
[21] Appl. No.: 682,810
[22] Filed: Dec. 17, 1984

Related U.S. Application Data

[63] Continuation-in-part of Ser. No. 629,580, Jul. 11, 1984, abandoned.

[51] Int. Cl.⁴ ............................................. H01L 43/02
[52] U.S. Cl. .................................................. 338/32 H
[58] Field of Search ........................... 338/32 H, 32 R; 323/294, 368; 324/251, 117 H

[56] References Cited

U.S. PATENT DOCUMENTS

| | | | |
|---|---|---|---|
| 3,143,714 | 8/1964 | Evans et al. | 338/32 H |
| 3,213,359 | 10/1965 | Freytag et al. | 338/32 H |
| 3,293,586 | 12/1966 | Cohen | 338/32 H |
| 3,339,129 | 8/1967 | Bulman et al. | 338/32 H |
| 3,551,706 | 12/1970 | Chapman | 338/32 H X |

FOREIGN PATENT DOCUMENTS 58-84478  5/1983  Japan ................................ 338/32 H Primary Examiner—E. A. Goldberg
Assistant Examiner—Lateef M. M.
Attorney, Agent, or Firm—Chernoff, Vilhauer, McClung & Stenzel

[57] ABSTRACT

A Hall effect probe having output voltage leads arranged across the surface of the probe so as to eliminate the distorting effect of voltages induced in the leads by a varying magnetic field includes in a three lead device, voltage leads connected at opposite corners of a rectangular probe and laid across the surface of the probe at an obtuse angle with respect to the edge so as to define a predetermined surface area. The leads are vertically stacked at an intersection point and extend parallel with one another and with the input current lead until clear of the magnetic field.

11 Claims, 6 Drawing Figures

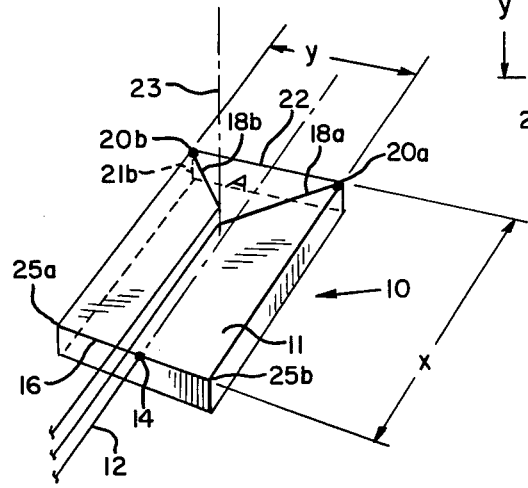
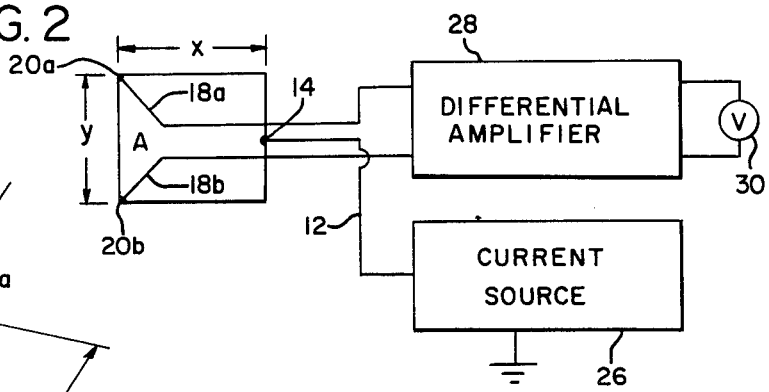
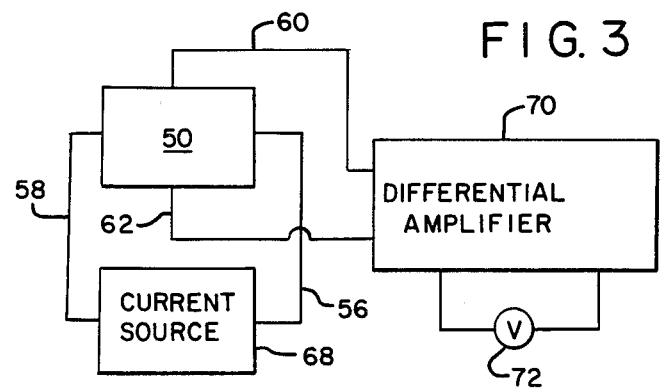
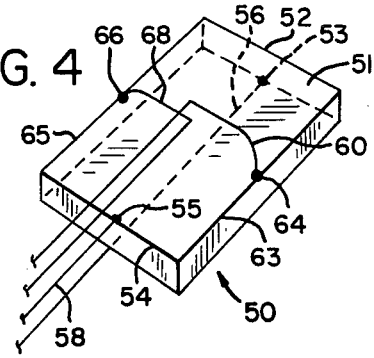
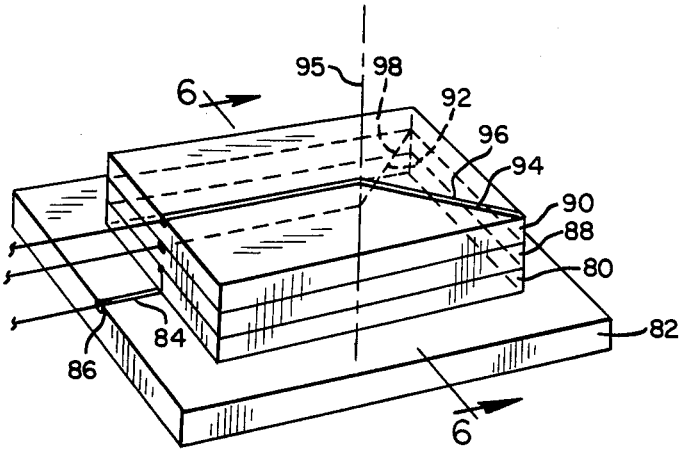
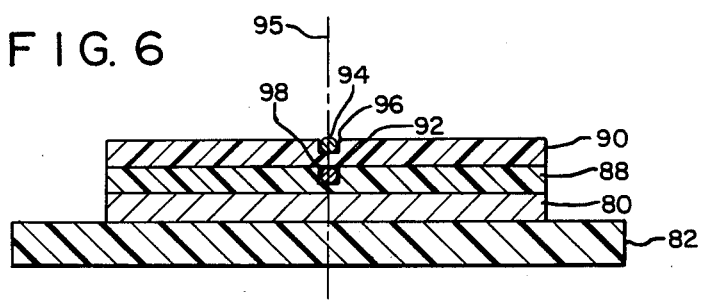

HALL EFFECT PROBE

BACKGROUND OF THE INVENTION

This application is a continuation in part of my copending application entitled Hall Effect Probe, Ser. No. 629,580, filed July 11, 1984 now abandoned.

The present invention relates to a Hall effect probe designed to minimize the error voltage caused by inductive pickup in the voltage output circuit of the probe.

A Hall effect probe is a device used for measuring certain properties of current flow and/or magnetic fields. The well-known principle of the Hall effect is that in a conductive or semiconductive body, a voltage potential will appear across that body at a right angle to the direction of current flow if the body is placed in a magnetic field where the lines of flux are substantially perpendicular to the direction of current flow. In many instances it is desired to use a Hall probe in an alternating magnetic field. In such cases, however, many Hall devices are limited in the upper frequency range because of the voltages induced in the output voltage leads and in the excitation current leads by the varying magnetic field. The amount of voltage induced is a function of both the rate of change of the magnetic field and the area of that portion of conductor loop crossed by the magnetic lines of flux.

In the past several solutions have been attempted to rectify this problem which have taken differing approaches. An example of an approach which uses an electronic compensation circuit is shown in Chapman U.S. Pat. No. 3,551,706. In Chapman an operational amplifier circuit provides an offset which compensates for the effect of voltages induced by the magnetic field in the Hall voltage output circuit. A different approach is shown in Bulman U.S. Pat. No. 3,339,129 and Evans U.S. Pat. No. 3,143,714. In each of these patents the wires constituting the Hall output voltage leads are configured so as to minimize the inductive pickup component in the voltage circuit resulting from the varying magnetic field. While these configurations eliminate to an extent the problem of induced voltages, they do not eliminate the problem entirely and in some cases contain other inherent undesirable limitations. For example, the device of the Bulman patent, while it seeks to reduce the area of the current loop formed by the Hall output voltage circuit, does not entirely eliminate the potential for induced voltages, since the voltage leads are twisted together while still within the influence of the magnetic field. Also, the current leads form a loop which lies within the magnetic field and thus voltages can be induced in the current loop which will, in turn, affect the Hall voltage which is a function of the product of the current and the magnetic field strength.

In the Evans patent, this problem is treated by providing two branches for one of the output leads, both of which are positioned across the surface of the Hall effect probe as in the Bulman device. This still leaves a current loop in the voltage output circuit; moreover, no attempt is made to deal with the loop area of the excitation current circuit. Thus the potential for induced error voltages remains.

SUMMARY OF THE INVENTION

The present invention solves the problem of induced voltages caused by a varying magnetic field in a simple, expedient and low-cost manner. According to the present invention, the Hall voltage output leads and the excitation current leads have configurations with respect to the surface of the Hall probe that effectively reduce their respective inductive current loop areas to zero.

In a three-lead Hall device the output voltage leads are connected to the probe at two adjacent corners, respectively. The Hall probe is a rectangular wafer which has a substantially planar surface. An input excitation current lead is attached to the wafer at the midpoint of one edge, and first and second output voltage leads are attached to the wafer at respective corners which are equidistant from the edge midpoint attachment of the excitation current lead. These corners could either be located along the edge to which the current lead is attached or could be the corners opposite this edge. The output voltage leads are laid across the surface of the wafer leading towards each other in linear fashion at an obtuse angle with respect to the edge. At a point on the surface of the wafer along its centerline bisecting the edge connecting the output leads, the leads intersect one another, thus forming a triangle on the surface of the wafer. This triangle has an area which is approximately equal to the ratio of the length of the edge connecting the corners to which the output leads are attached to the perimeter of the wafer.

The leads may be placed one on top of the other and may extend away from the intersection point in substantially parallel relation. As an alternative, the leads may be twisted together in helical fashion or "pigtailed" and extended along the surface of the wafer beyond an edge thereof to a point outside the influence of the magnetic field in which the probe is to be immersed.

In a four-lead Hall effect device the leads are connected at the midpoints opposite parallel edges. The leads extend toward each other across the surface of the probe colinearly to a point approximately midway between the two corners or edges. The leads then make a right angle and extend across the surface of the wafer one on top of the other to the opposite edge of the probe where one of the excitation current leads is connected at the midpoint of the edge. Thus the two output voltage leads pass adjacent the contact point of one input excitation current lead. The other excitation current lead is connected to the midpoint of the opposite edge and extends beneath the probe towards the midpoint of the first edge in a direction substantially parallel to the two output voltage leads as they extend across the surface of the wafer, one on top of the other.

Positioning the leads with respect to the surface of the Hall probe in this manner effectively reduces to zero the area of the current loops formed by both the Hall voltage and excitation current circuits.

It is primary object of this invention to provide a Hall effect probe which substantially reduces the error induced by a varying magnetic field at a high frequency.

It is a further object of this invention to provide a lead configuration for a Hall probe which reduces errors resulting from induced voltages by minimizing the respective inductive loop areas of the circuits formed by the leads.

A still further object of this invention is to provide error correction in a Hall probe comprising the simple and inexpensive expedient of aligning the input and output leads in a particular manner with respect to the surface of the probe.

BRIEF DESCRIPTION OF THE DRAWINGS

FIG. 1 is a perspective view of a rectangular three-lead Hall effect probe with the Hall effect voltage and excitation current leads arranged according to the invention.

FIG. 2 is a block diagram of the circuit of the device shown in FIG. 1.

FIG. 3 is a block diagram of a circuit for a four-lead Hall effect probe as shown in FIG. 4.

FIG. 4 is a four-lead Hall effect probe with Hall voltage and excitation current leads arranged according to the invention.

FIG. 5 is a perspective view of a three-lead Hall probe with the leads embedded in dielectric layers for precise positioning.

FIG. 6 is an end cutaway view taken along line 6—6 of FIG. 5.

DETAILED DESCRIPTION OF THE INVENTION

A three-lead Hall probe 10 is shown in FIG. 1. The probe 10 is adapted to be oriented perpendicular to the lines of flux of a magnetic field (not shown). The Hall probe has a planar surface 11 of rectangular shape and is constructed of any suitable semiconductor material. An excitation current lead 12 is connected at a point 14 which is a midpoint along edge 16 on surface 11 and is generally colinear with centerline CL indicated by the dash-dot line in FIG. 1. Output voltage leads 18a and 18b are connected to probe 10 at contact points 20a and 20b, respectively. These contact points are located in opposite corners 21a and 21b along an edge 22 on surface 11 which is opposite edge 16. The leads 18a and 18b extend at an obtuse angle with respect to edge 22 from contact points 20a and 20b towards each other to a point of intersection along junction line 23 equidistant from corners 21 and 21b and also equidistant from corners 25a and 25b which are connected by edge 16. At the junction line 23 slightly above surface 11 the leads are bent and are positioned one on top of the other. The leads 18a and 18b then extend towards the contact point 14 in vertically stacked parallel relation. From contact point 14 the three leads, 18a and 18b, and excitation current lead 12, extend away from the probe body 10 in a plane substantially perpendicular to surface 11.

The circuit of the device shown in FIG. 1 is illustrated schematically in FIG. 2. A current source 26 provides current for excitation lead 12 which attaches to the Hall probe at contact point 14. The current flows between point 14 and points 20a and 20b encountering resistance within the body of the probe and the Hall voltage therefore appears between contact points 20a and 20b. This voltage is amplified by a differential amplifier 28 and displayed by voltmeter 30.

With the output voltage leads 18a and 18b configured as described above a triangular area A is defined on the surface 11 of the probe 10. It has been determined experimentally that the optimum area for triangle A is equal to the ratio of the length of the edge 22 (shown as dimension y in FIG. 1) to the perimeter $2y+2x$ (x being the dimension of the edges at right angles to edge 22). Expressed algegraically:

$$A = \frac{y}{2y + 2x}(xy)$$

For a square Hall probe, A is equal to $\frac{1}{4}$ of the area of surface 11. As y becomes larger than x the area A increases from $\frac{1}{4}$ of the surface area of surface 11 towards a limit of $\frac{1}{2} xy$. If y were to become less than x the optimum area A would lie between $\frac{1}{4} xy$ and zero.

If leads 18a and 18b are configured on the surface 11 of the probe 10 so as to define area A, there will be no induced voltage in the leads resulting from the magnetic field in which the probe 10 is immersed. The precise reason for this phenomenon, although it has been experimentally proven, is not known.

Tests were conducted using a three lead Hall probe immersed in a magnetic field having a field strength of 2000 gauss and a frequency of 1000 Hz. An excitation current input comprising a 40 microsecond square wave was impressed upon the Hall probe. With the leads in the configuration of FIG. 1 the Hall voltage output waveform matched the excitation current waveform with extremely low distortion. With a square wave input there is usually a larger voltage spike that results from induced voltage in the output voltage leads caused by the magnetic field. The lead configuration used in the test above, however, reduced this voltage spike to a minimum.

FIGS. 3 and 4 show the invention in a four-lead configuration. In FIG. 4 a Hall probe 50 includes a surface 51, and edges 52 and 54. A pair of excitation current leads 56 and 58 are connected to the probe at contact points 53 and 55, respectively, which lie midway between the respective corners defining edges 52 and 54. A pair of Hall voltage leads 60 and 62 are connected to opposite edges 63 and 65, respectively, at contact points 64 and 66 which lie midway between the respective corners defining edges 63 and 65. The voltage leads 60 and 62 extend colinearly towards each other across surface 52 until they meet, make a right angle and then extend towards point 55 vertically stacked in a plane perpendicular to surface 51. Lead 56 extends under probe 50 towards edge 54 such that it lies in a plane coplanar with leads 60 and 62 which plane is also perpendicular to surface 51. At edge 54 leads 60, 62 and 56 are joined by current lead 58, and all four leads extend away from probe 50 in a plane perpendicular to surface 51 until clear of the magnetic field in which the probe is placed.

In FIG. 3 is shown a typical circuit for measuring the Hall voltage. There are many applications for use of the Hall effect and the circuit of FIG. 5 is provided as an example of a simple measuring circuit. Hall excitation current leads 56 and 58 are connected to current source 68. Hall output voltage leads 60 and 62 are connected to a differential amplifier 70 which drives a voltmeter 72.

FIG. 5 and 6 show an exemplary method of positioning the voltage and current leads so that they lie in a plane substantially perpendicular to the surface of the probe body as they extend across its surface and are held at the proper angle with respect to the edge of the probe 80. A Hall probe body 80 rests on a wafer 82 constructed of dielectric material such as plastic. The wafer 82 has a notch or channel 84 extending parallel to the probe body 80 for supporting a current lead 86. Above probe 80 are two dielectric wafers 88 and 90 similar to wafer 82 which support Hall voltage leads 92 and 94. Wafers 88 and 90 have notches or channels 96 and 98, respectively, which are parallel to each other from junction line 95 to beyond the boundary of the probe 80 and to notch 84 so that all of the leads 86, 94 and 92 lie vertically stacked in a plane perpendicular to the surface of probe 80. The notches 96 and 98 approach the junction line 95 at the proper obtuse angle as described above in reference to FIG. 1.

The leads 92, 94 and 86 need not necessarily be made of wire but may consist of thin conducting film, in which case the supporting wafers 82, 88 and 90 may be made thinner. Also, an additional wafer may be added for a four-lead device, it being understood that it will have a notch aligning the lead that it supports coplanar with the other leads in a plane perpendicular to the Hall probe's surface allowing it to extend underneath the probe 80 to the edge opposite the connecting point for lead 84.

If if is not practicable to extend the leads beyond the probe body positioned one on top of the other, the leads may be formed into a bundle and twisted together.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A Hall effect probe including a rectangular wafer having a substantially planar surface comprising:
    (a) an input lead attached to said wafer at a mid-point of a first edge;
    (b) first and second output leads attached to said wafer at respective corners of a second edge of said wafer;
    (c) said second edge being parallel to said first edge;
    (d) said leads extending towards each other across the surface of said wafer to an obtuse angle with respect to said first edge toward a point on the surface of said wafer, at which point said first and second output leads intersect one another; and
    (e) wherein the area of the surface of the wafer bounded by said first and second output leads and by said second edge of said wafer is approximately equal to a predetermined fraction of the total surface area of the wafer, said fraction determined by the ratio of the length of the second edge to the total perimeter of the wafer.

2. The Hall effect probe of claim 1 wherein said leads extend away from said point of intersection of said leads in substantially parallel relation.

3. The probe of claim 2 wherein the output leads are disposed in vertically stacked relation at the point of intersection of said leads and said leads extend from said point across the surface of the wafer for a predetermined distance beyond an edge of said wafer.

4. The probe of claim 3 wherein said leads extend across the surface of said wafer from said point of intersection of said leads linearly towards said midpoint of said first edge.

5. The probe of claim 1 including output lead guide means for guiding said first and second output leads along the surface of said probe including notched wafer means for providing a channel for holding each of said leads in a predetermined position.

6. The probe of claim 5 including a first notched wafer for said first output lead and a second notched wafer stacked vertically on top of said first notched wafer for said second output lead.

7. A Hall effect probe including a rectangular wafer having a substantially planar surface comprising:
    (a) a substantially rectangular planar body of semiconductor material having first and second current lead connection points spaced at approximately the midpoints of opposite edges of said body, respectively;
    (b) first and second Hall voltage output contact points said first Hall voltage output contact point being located along an edge of said body, and said second Hall voltage output contact point being located along an opposite edge of said body, said edges being perpendicular to the edges occupied by said current lead connection points;
    (c) first and second excitation current leads connected to said current lead connection points, respectively, a first one of said leads extending along a surface of said body linearly towards said second current lead connection point; and
    (d) a pair of output voltage leads connected to said voltage output contact points respectively, said leads extending colinearly towards each other across the surface of said body to a point equidistant between said voltage contact points and thence extending parallel to said first current lead towards said second current lead contact point.

8. The device of claim 7 wherein at least portions of said colinearly-extending voltage leads and said first excitation current lead are positioned adjacent one another in vertically stacked relation in a plane substantially perpendicular to the surface of said body.

9. The device of claim 8 including a plurality of thin plates, each having substantially the same shape as said body positioned one on top of the other, each plate having a linear groove for holding one each of said leads.

10. A Hall effect probe comprising a wafer having a substantially planar surface and including an input current lead connected to a point on a first edge of the wafer and including two output leads attached to first and second points along second and third edges of the wafer respectively, the output leads extending across the surface of the wafer generally towards each other, intersecting at a point on the surface of the wafer, and thence extending adjacent one another towards the input lead, wherein an area of the surface of the wafer enclosed by the path of the output leads and a periphery of the wafer connecting the first and second points is equal to a fraction of the total surface area of the wafer, said fraction determined by the ratio of the length of a periphery of the wafer connecting the first and second points to the total perimeter of the wafer.

11. The Hall effect probe of claim 10 wherein the wafer is rectangular and the first edge is perpendicular to both the second and third edges.

* * * * *

UNITED STATES PATENT AND TRADEMARK OFFICE
CERTIFICATE OF CORRECTION

PATENT NO. : 4,660,018

DATED : April 21, 1987

INVENTOR(S) : Victor W. Hatch

It is certified that error appears in the above-identified patent and that said Letters Patent is hereby corrected as shown below:

| | |
|---|---|
| Col. 2, line 56 | After "is" insert --a-- |
| Col. 3, line 62 | Change "algegraically" to --algebraically-- |
| Col. 5, line 13 | Change "if" (second occurrence), to --it-- |
| Col. 5, line 36 | Change "to" to --at-- |

Signed and Sealed this

Twenty-seventh Day of February, 1990

*Attest:*

JEFFREY M. SAMUELS

*Attesting Officer*   *Acting Commissioner of Patents and Trademarks*